United States Patent [19]
Lee et al.

[11] Patent Number: 5,644,246
[45] Date of Patent: Jul. 1, 1997

[54] PROBE CARD LOCKING DEVICE OF A SEMICONDUCTOR WAFER PROBE STATION

[75] Inventors: Dong-Seck Lee, Kyoungki-do; Ung-Gi Park, Seoul; Wha-Young Kim, Pusan, all of Rep. of Korea

[73] Assignee: Hyundai Electronics Industries Co., Ltd., Ich'on, Rep. of Korea

[21] Appl. No.: 624,140

[22] Filed: Mar. 29, 1996

[30] Foreign Application Priority Data

Apr. 6, 1995 [KR] Rep. of Korea ................. 95-7935

[51] Int. Cl.[6] ........................................... G01R 31/02
[52] U.S. Cl. ............................................. 324/754
[58] Field of Search ........................ 324/754, 72.5, 324/158.1, 73.1, 755, 758, 765; 439/482; 29/832; 269/60, 70, 71, 21

[56] References Cited

U.S. PATENT DOCUMENTS

| | | | |
|---|---|---|---|
| 4,321,122 | 3/1982 | Whitcomb et al. | 324/754 |
| 5,325,052 | 6/1994 | Yamashita | 324/765 |
| 5,489,853 | 2/1996 | Nakajima | 324/73.1 |
| 5,521,522 | 5/1996 | Abe et al. | 324/758 |
| 5,559,446 | 9/1996 | Sano | 324/754 |

*Primary Examiner*—Vinh P. Nguyen
*Attorney, Agent, or Firm*—Ware, Fressola, Van Der, Sluys & Adolphson LLP

[57] ABSTRACT

A probe card locking device of a semiconductor wafer probe station for locking a probe card by using a tensile force of springs solves an unbalance issue in a locking operation, facilitates the operation via an automation and shortens setup time. A pair of frames are respectively formed with support steps for supporting both sides of a probe card and installed in a tester head in parallel with each other to be spaced apart by a prescribed distance. A pair of locking members have pressing steps for pressing both sides of the probe card from above supported by the support steps of the frames. Plural springs are installed between the locking members and frames for elastically supporting the locking members for allowing a close attachment to the frames with a prescribed force for locking the probe card. A pair of driving cams respectively attached to outer planes of the locking members are provided with slanted driving planes driven to ascend and descend the locking members by means of bearings on pistons of a pair of air cylinders, which slidably reciprocate while being in contact with the slanted driving planes of the driving cams.

4 Claims, 3 Drawing Sheets

PROBE CARD LOCKING DEVICE OF A SEMICONDUCTOR WAFER PROBE STATION

BACKGROUND OF THE INVENTION

1. Field of the Invention

The present invention relates to a probe station for testing a semiconductor wafer, and more particularly to a probe card locking device of a semiconductor wafer probe station for locking a probe card with a prescribed force.

2. Description of the Prior Art

Probing is one kind of a semiconductor analysis apparatus which includes a characteristics test of respective chips or the like upon a semiconductor wafer having passed through a predetermined unit process. The probing is performed by a device for testing the characteristics of a corresponding chip by setting up a probe on a transistor or pad of an IC chip. There is a known REL-5000 series probe station manufactured by Cascade Microtech, Inc. in the United States sold under the trademark of "alessi".

In the REL-5000 series probe station, the probe card is mounted to the pads of a transistor or IC chip placed onto a probe card holder, and an electron microscope having a objective stand on which the probe card is disposed is utilized to perform the test with respect to the characteristics of the corresponding chip, etc.

The probe card mounted to the probe card holder is formed of a small-sized substrate substantially shaped as a rectangle. An externally-connecting pad for connection to a tester and so forth is formed to one side of the substrate. A plurality of probes for transmitting/receiving signals by contacting the corresponding chip of the semiconductor wafer are arranged around the periphery of a thruhole formed in the center of the probe card.

The probe card is disposed on the semiconductor wafer placed on the probe card holder, in which the probes extend toward the center of the thruhole to correspondingly contact the pads of the chip on a one to one basis in order to communicate signals between the chip and tester, thereby performing the test. At this time, since the probes of the probe card must simultaneously contact the pads of the chip, to ensure exactness of the test, the accurate position setting of the probe card is very important.

For this operation, the probe card holder is provided to a head of the tester to accurately lock the probe card to its position.

This conventional probe card locking structure using the probe card holder as above will be described below.

The probe card holder includes locking members for downwardly pressing to lock opposite sides of the probe card. The locking members are attached/detached and moved upwardly and downwardly by means of a plurality of securing bolts. By releasing the bolts, the locking members are separated from a pair of frames of the holder (or the locking members are spaced apart from the frames of the holder by a predetermined distance). Then, the probe card is seated in a space formed between the frames of the holder. By screwing the bolts, the locking members press the probe card seated on the frames of the holder. Therefore, the probe card is fixed due to the pressing of the locking members, and the plurality of probes are thereby locked to make overall contact with the pads of the corresponding chip.

In the above-described probe card locking device, however, after the bolts are released to separate the locking members from the frames, a probe card is mounted to the space between two members. Then, the locking members are joined for being locked by screwing the bolts, which makes the locking operation troublesome. In addition, the coupling force exerted upon respective bolts as they are screwed down is different, causing displacement of the probe card toward any one direction when being locked, thereby causing a contact failure. Consequently, a lot of set-up time for correcting the displacement is required.

Moreover, the conventional probe card locking device in using bolts for carrying out the locking operation can be adversely affected in regard to usage or safety aspects of the system since the locking bolts can be inadvertently dropped on the probe card or semiconductor wafer to cause damage of the probe card, deterioration of the semiconductor wafer, etc.

SUMMARY OF THE INVENTION

Accordingly, it is an object of the present invention to provide a probe card locking device of a probe station for testing a wafer capable of facilitating an operation, solving an unbalance problem in locking a probe card and shortening set-up time.

It is another object of the present invention to provide a probe card locking device of a probe station for testing a wafer, in which locking bolts are not employed for preventing damage upon a probe card and an inferior wafer resulting from a possible inadvertent dropping of the locking bolt and to enhance stability when operating a system.

To achieve the above objects of the present invention, there is provided a probe card locking device of a semiconductor wafer probe station, in which a pair of frames are respectively formed with support stands for supporting opposite sides of a probe card and installed on a tester head in parallel with each other to be spaced apart by a prescribed distance. Here, a pair of locking members have pressing stands installed to upper portions of the frames for pressing the respective opposite sides of the probe card from above supported by the support stands of the frames. A plurality of springs are installed between the locking members and the frames for elastic support to allow the locking members to closely attach to the frames with a prescribed force for locking the probe card. Driving cams attached to each of outer planes of the locking members are provided with slanted driving planes to lower planes. Also, a pair of air cylinders have pistons for slidably reciprocating while being in contact with the slanted driving planes of the driving cams.

At this time, guide posts are projected downwardly from both sides of the lower plane of the locking member, and guide holes for being inserted with the guide posts are formed in the frames.

Preferably, a roller is installed at the end of the piston of the air cylinder to roll along the slanted driving plane of the driving cam in contact therewith.

In addition, it is preferable that an air pressure of the air cylinder is at least 80 psi.

These and other objects, features and advantages of the present invention will become more apparent in light of the detailed description of a best mode embodiment thereof, as illustrated in the accompanying drawing.

DETAILED DESCRIPTION OF THE PREFERRED EMBODIMENT

Hereinafter, a preferred embodiment of a probe card locking device of a semiconductor wafer probe station 10 according to the present invention will be described with reference to accompanying drawings.

Figure 1:
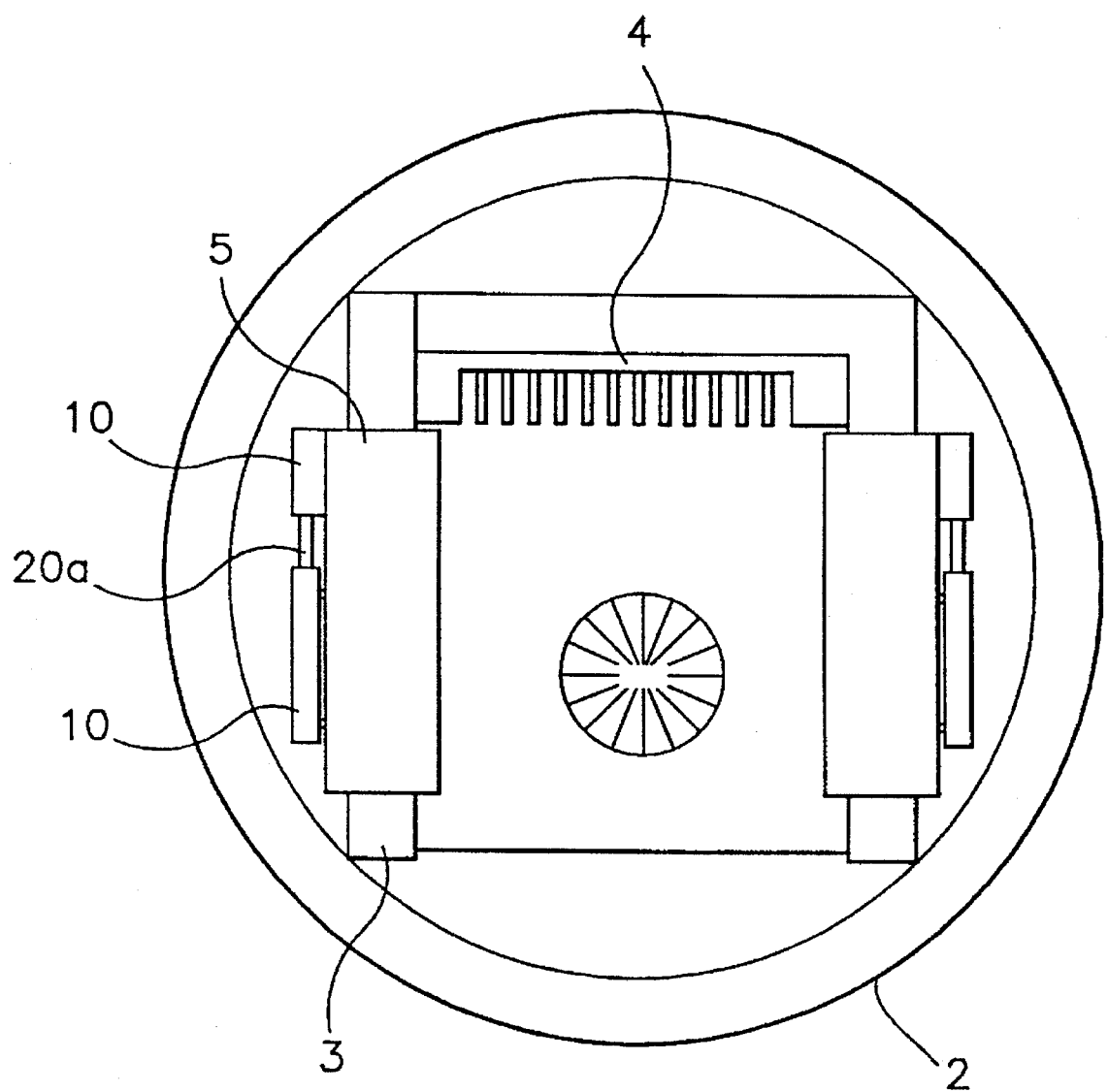
FIG. 1 is a plan view showing a locked probe card in a probe card locking device according to the present invention.

FIG. 1 is a plan view showing a state of locking a probe card of the probe card locking device according to the present invention. As shown in FIG. 1, a ring carrier 2 is installed to a platen 1 shown in FIG. 2 which corresponds to an objective stand of an electron microscope, and a pair of frames 3 are installed within the ring carrier 2 to be parallel with each other by maintaining a prescribed distance (preferably, a distance corresponding to the width of a probe card 4).

Figure 2:
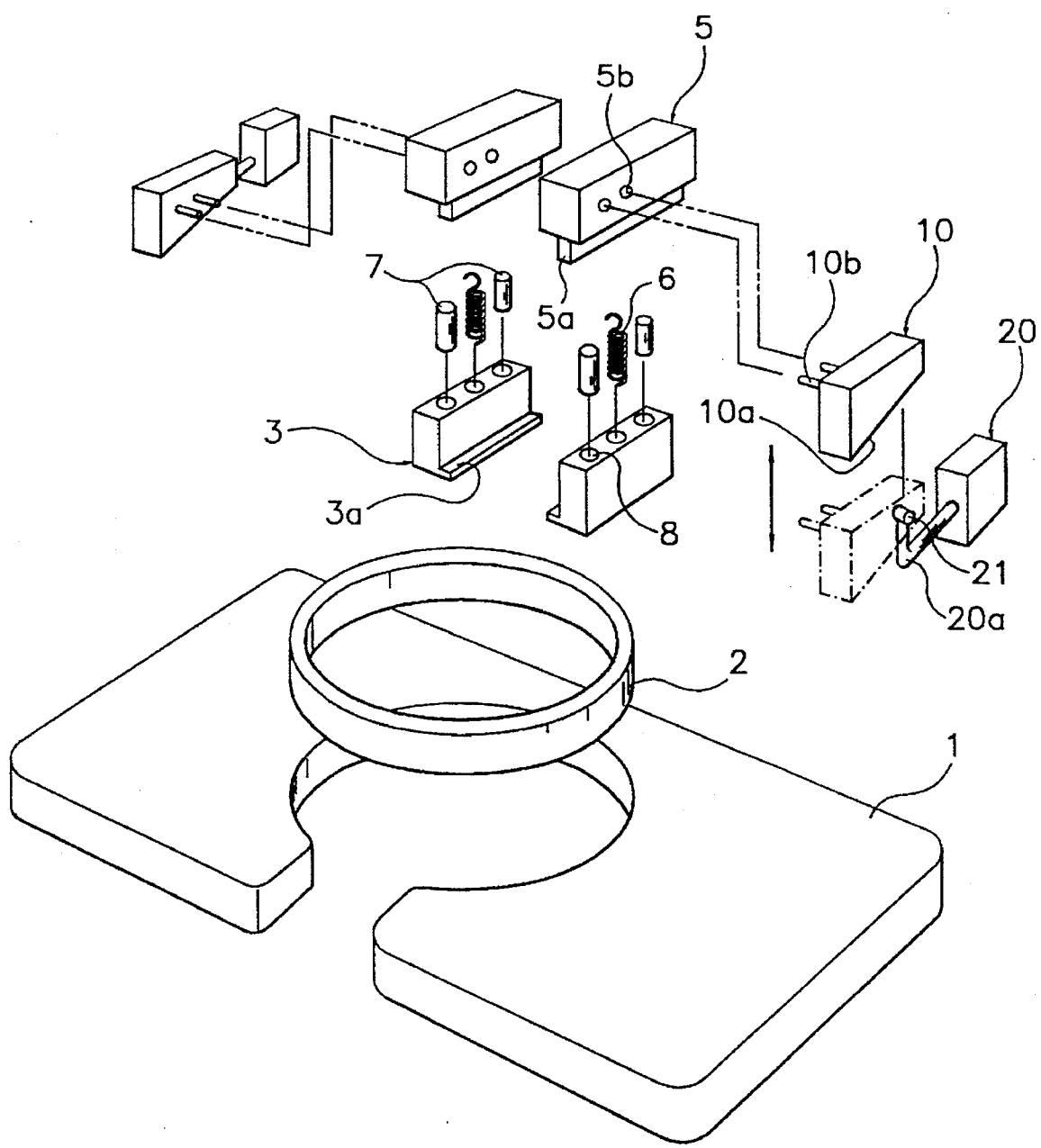
FIG. 2 is an exploded perspective view showing a structure of a probe card locking device according to the present invention.

FIG. 2 is an exploded perspective view showing the structure of the probe card locking device according to the present invention. Referring to FIG. 2, support steps 3a are formed to opposing planes of respective frames 3 for supporting opposite sides of the probe card 4.

Each of the frames 3 has a locking member 5 formed with a pressing step 5a for pressing and locking the opposite sides of the probe card 4 from above which is supported by support stand 3a, and the locking member 5 is deflected to tightly close to the frame 3 by means of a spring 6 provided to the center thereof. In association with the deflection force of the locking members 5 caused by elasticity of springs 6, the probe card 4 is locked between the support steps 3a of the frames 3 and the pressing steps 5a of the locking members 5.

When considering the joining relation between the locking members 5 and frames 3, a tensile force resulting from the springs 6 is uniformly applied upon the locking members 5 by means of cylinder-shaped guide posts 7 inserted to guide holes 8 in the lower surface of each of the locking members 5 and the frames 3. By this operation, the locking members 5 are not deflected at any direction when operating air cylinders 20 but maintains balance while ascending and descending, so that a uniform pressing force can be exerted on the probe card 4.

For performing the ascending and descending movement of the locking members 5, each driving cam 10 having a slanted driving plane 10a is installed at an outer plane of the locking member 5, respectively, and the air cylinders 20 is installed to the side of each of the frames 3 (only one cylinder is illustrated). A roller 21 installed to a piston 20a of air cylinder 20 is in contact with slanted driving plane 10a of driving cam 10. By the reciprocating motion of the piston 20a of the air cylinder 20, the driving cam 10 is moved upward and downward along the slanted driving plane 10a in conformity with the inclination thereof, so that the locking member 5 is elevated along a prescribed stroke distance.

A driving cam 10 is provided to one side of each of the locking members 5 in such a manner that locking bars 10b are inserted to locking holes 5b. As described above, the guide rollers 21 are installed at the end of piston 20a of the respective air cylinders 20, which contact the slanted driving planes 10a to attain a smooth operation.

In the above-described structure, the elevating height of the locking member 5 may be changed in accordance with the inclination of slanted driving plane 10a. Also, the air cylinders 20 are driven by air typically supplied to the system. At this time, a pressure of the air cylinder 20 is preferably at least 80 psi. The air cylinders 20 are connected to a system operating controller (not shown) to be operated in a one-touch mode which is executed by pressing a button of the controller.

Figure 3:
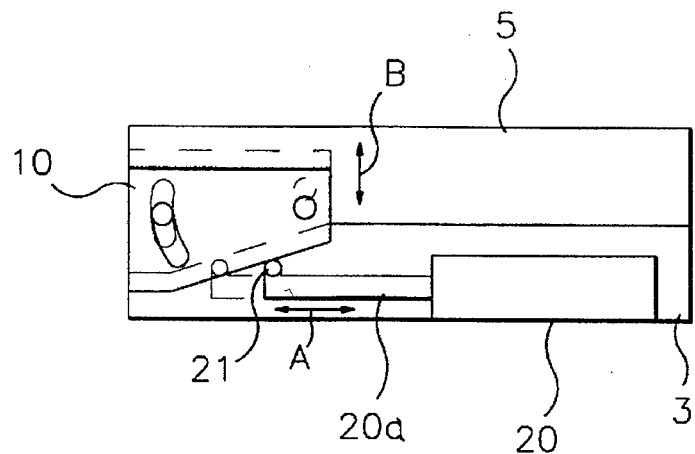
FIGS. 3 to 5 are detailed views showing the construction and operation of the major portion of the present invention.
Figure 4:
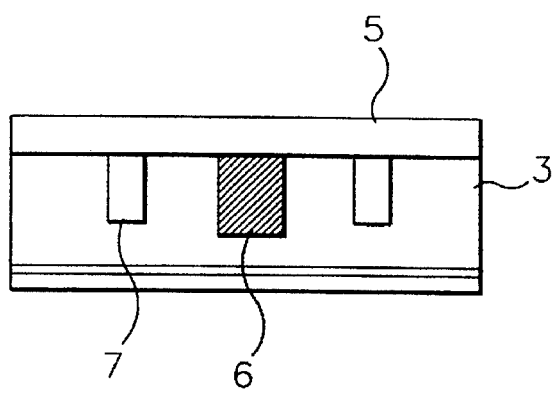
Figure 5:
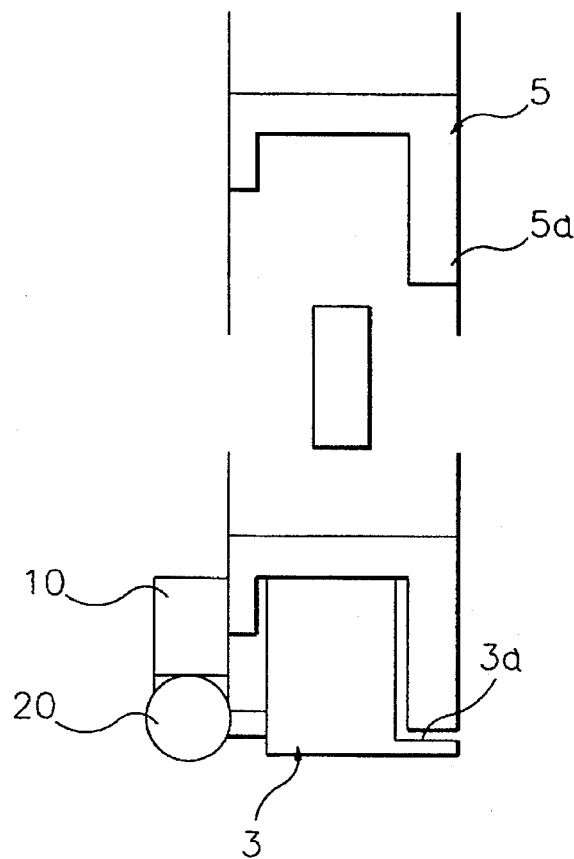

An operation and effect therefrom of the probe card locking device according to the present invention described as above will be described with reference to FIGS. 3, 4 and 5.

Initially, the pair of locking members 5 are tightly closed on the frames 3 by the tensile force of the plurality of the springs 6. In this state, once a user presses the button on a system controller for driving the air cylinders 20 for mounting the probe card 4 or exchanging it with a new one, the air cylinders 20 are driven and respective pistons 20a advance toward the left in FIG. 3, in the direction of an arrow A. Then, the driving cams 10 ascend along the slanted driving planes 10a in the direction of an arrow B to be moved to the position as designated by a short-dashed line. Also, the locking members 5 ascend in accordance with the movement of driving cams 10. Therefore, a predetermined space as shown in FIG. 5 is formed between the support steps 3a of the frames 3 and the pressing steps 5a of the locking members 5.

After both sides of the probe card 4 are inserted to the space between the locking members 5 and the frames 3 formed as above, the air cylinders 20 are operated in the opposite direction by the operation of the driving button. Then, the pistons 20a of the air cylinders 20 retreat along the direction of an arrow A toward the right as shown in FIG. 3. At this time, the locking members 5 are elastically supported downward by the springs 6 to descend in the direction of an arrow B.

By this operation, the pressing steps 5a of the locking members 5 are closely attached to the support steps 3a of the frames 3, so that the probe card 4 is locked between the locking members 5 and the frames 3. Here, when the locking members 5 descend, the guide posts 7 installed to the locking members 5 descend while being inserted to the guide holes 8 of the frames 3. As a result, the locking members 5 uniformly descend in such a way as not to be unbalanced in any direction to allow the probe card 4 to be locked without being displaced.

The probe card locking device according to the present invention described as above adopts a driving system using the tensile force of the spring and air pressure to automatically lock the probe card. Meantime, the unbalance of the probe card which has been a problem in the conventional manual system is solved to easily, quickly and accurately lock the probe card.

Furthermore, the structure of the probe card locking device according to the present invention is simplified while eliminating the typical problems of an imbalance of the probe card due to the different bolting forces and damage upon the probe card or semiconductor wafer due to an inadvertent drop of a bolt, which have heretofore occurred in the conventional bolt locking system.

While the present invention has been particularly shown and described with reference to a particular embodiment thereof, it will be understood by those skilled in the art that various changes in form and details may be effected therein without departing from the spirit and scope of the invention as defined by the appended claims.

What is claimed is:

1. A probe card locking device of a semiconductor wafer probe station comprising:

a pair of frames respectively formed with support steps for supporting opposite sides of a probe card and installed in a tester head in parallel with each other for spacing apart by a prescribed distance;

a pair of locking members each having a pressing step provided for pressing said opposite sides of said probe card supported by said support steps of said frames;

a plurality of springs installed for elastic support between said locking members and said frames to allow said locking members to press said frames with a prescribed force for locking said probe card;

driving cams respectively attached to outer planes of said locking members and provided with slanted driving planes; and a pair of air cylinders having pistons for slidably reciprocating while being in contact with said slanted driving planes of said driving cams.

2. The probe card locking device of a semiconductor wafer probe station as claimed in claim 1, wherein guide posts are provided between said frames and said locking members for evenly guiding movement between said frames and said locking members.

3. The probe card locking device of a semiconductor wafer probe station as claimed in claim 1, wherein a roller is installed at an end of said piston of each of said air cylinders, and is rolled along said slanted driving plane of said driving cam in contact therewith.

4. The probe card locking device of a semiconductor wafer probe station as claimed in claim 1, wherein an air pressure of said air cylinder is at least 80 psi.

* * * * *